(12) United States Patent
Kim (10) Patent No.: US 11,061,577 B2
(45) Date of Patent: Jul. 13, 2021

(54) SYSTEM ON CHIP PERFORMING TRAINING OF DUTY CYCLE OF WRITE CLOCK USING MODE REGISTER WRITE COMMAND, OPERATING METHOD OF SYSTEM ON CHIP, ELECTRONIC DEVICE INCLUDING SYSTEM ON CHIP

(71) Applicant: SAMSUNG ELECTRONICS CO., LTD., Suwon-si (KR)

(72) Inventor: Yongseob Kim, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/460,291

(22) Filed: Jul. 2, 2019

(65) Prior Publication Data
US 2020/0133505 A1 Apr. 30, 2020

(30) Foreign Application Priority Data
Oct. 30, 2018 (KR) ........................ 10-2018-0130845

(51) Int. Cl.
| | |
|---|---|
| G11C 11/4076 | (2006.01) |
| G06F 3/06 | (2006.01) |
| G11C 11/4096 | (2006.01) |

(52) U.S. Cl.
CPC .......... *G06F 3/0611* (2013.01); *G06F 3/0659* (2013.01); *G06F 3/0673* (2013.01); *G11C 11/4076* (2013.01); *G11C 11/4096* (2013.01)

(58) Field of Classification Search
CPC ..................................................... G11C 7/222
USPC ......................................................... 365/233.1
See application file for complete search history.

(56) References Cited

U.S. PATENT DOCUMENTS

| | | | |
|---|---|---|---|
| 6,583,657 B1 * | 6/2003 | Eckhardt ............. | H03K 5/1565 327/172 |
| 6,715,096 B2 | 3/2004 | Kuge | |
| 7,363,178 B2 * | 4/2008 | Boerstler ........... | G01R 29/0273 702/79 |
| 7,417,567 B2 | 8/2008 | Swoboda | |
| 7,715,253 B2 * | 5/2010 | Kim ..................... | G11C 7/1072 365/193 |

(Continued)

FOREIGN PATENT DOCUMENTS

| | | |
|---|---|---|
| JP | 4588110 B2 | 11/2010 |
| KR | 2001-0082149 A | 8/2001 |

(Continued)

*Primary Examiner* — Min Huang
(74) *Attorney, Agent, or Firm* — Sughrue Mion, PLLC (57) ABSTRACT

A system on chip includes a first clock generator that generates a first clock to be sent to a memory device, a second clock generator that generates a second clock to be sent to the memory device, a command and address generator that generate a code for adjusting a duty cycle of a third clock generated within the memory device based on the second clock and generates a command for storing the code to mode registers of the memory device, the third clock being used for a data input/output of the memory device, a data receiver that receives a data strobe signal and a data input/output signal output from the memory device receiving the command and the code synchronized with the first clock, and a training circuit that calculates a plurality of valid window margins for the code based on the data strobe signal and the data input/output signal.

20 Claims, 9 Drawing Sheets

(56) References Cited

U.S. PATENT DOCUMENTS

| | | |
|---|---|---|
| 7,821,317 B2 | 10/2010 | Jang |
| 9,673,798 B1 | 6/2017 | Tang et al. |
| 9,818,471 B1 | 11/2017 | Oh et al. |
| 2009/0168559 A1* | 7/2009 | Seo ................... G11C 7/1093 365/189.15 |
| 2014/0173325 A1* | 6/2014 | Ryu ................... G06F 13/1689 713/601 |
| 2017/0004869 A1* | 1/2017 | Shin .................. G11C 11/4087 |
| 2018/0102151 A1* | 4/2018 | Kim ................... G11C 7/1093 |
| 2018/0286471 A1* | 10/2018 | Hotaruhara ............ G11C 7/222 |
| 2019/0172516 A1 | 6/2019 | Kim |
| 2019/0371376 A1* | 12/2019 | Kim ................... H03K 5/1565 |
| 2020/0133542 A1* | 4/2020 | Kim ................... G11C 11/4076 |

FOREIGN PATENT DOCUMENTS

| | | |
|---|---|---|
| KR | 10-0891335 B1 | 3/2009 |
| KR | 10-2009-0072269 A | 7/2009 |
| KR | 10-2011-0081958 A | 7/2011 |
| KR | 10-2019-0065789 A | 6/2019 |

\* cited by examiner

SYSTEM ON CHIP PERFORMING TRAINING OF DUTY CYCLE OF WRITE CLOCK USING MODE REGISTER WRITE COMMAND, OPERATING METHOD OF SYSTEM ON CHIP, ELECTRONIC DEVICE INCLUDING SYSTEM ON CHIP

CROSS-REFERENCE TO THE RELATED APPLICATIONS

This application claims priority from Korean Patent Application No. 10-2018-0130845 filed on Oct. 30, 2018, in the Korean Intellectual Property Office, the disclosure of which is incorporated herein in its entirety by reference.

BACKGROUND

Embodiments of the inventive concept described herein relate to a system on chip (SoC) performing training of a duty cycle of a write clock by using a mode register write command, an operating method of the SoC, and an electronic device including the SoC.

An SoC is an integrated circuit in which a plurality of components or a plurality of intellectual properties (IPs) of an electronic system are integrated. The SoC may communicate with a memory device outside the SoC. In recent years, as operating speed of the SoC and the memory device increase, the SoC should perform a plurality of trainings on the memory device before communicating with the memory device at high speed. The SoC may provide a write clock, which is independent of a clock, for a high-speed data input/output with respect to the memory device. In general, since a frequency of the write clock is higher than a frequency of the clock, it is necessary to accurately adjust a duty cycle of the write clock.

SUMMARY

Various embodiments of the inventive concept provide a system on chip (SoC) performing a training of a duty cycle of a write clock by using a mode register write command, an operating method of the SoC, and an electronic device including the SoC.

According to an aspect of exemplary embodiments, there is provided an SoC which may include: a first clock generator that generates a first clock to be sent to a memory device; a second clock generator that generates a second clock to be sent to the memory device; a command and address generator that generate a code for adjusting a duty cycle of a third clock generated within the memory device based on the second clock and generates a command for storing the code to mode registers of the memory device, the third clock being used for a data input/output of the memory device; a data receiver that receives a data strobe signal and a data input/output signal output from the memory device receiving the command and the code synchronized with the first clock; and a training circuit that calculates a plurality of valid window margins for the code based on the data strobe signal and the data input/output signal.

According to an aspect of exemplary embodiments, there is provided an operating method of an SoC connected with a memory device. The method may include: changing a code to be sent to the memory device in synchronization with a first clock, the code being used to adjust a duty cycle of a third clock which is generated within the memory device based on a second clock generated from the SoC, and is used for a data input/output of the memory device, calculating a plurality of valid window margins for the code based on a data strobe signal and a data input/output signal output from the memory device receiving the code, and sending a target value of the code corresponding to a maximum valid window margin of the plurality of valid window margins to the memory device.

According to an aspect of exemplary embodiments, there is provided an electronic device which may include: an SoC that generates a first clock and a second clock having a frequency higher than a frequency of the first clock; and a memory device synchronized with the first clock and the second clock output from the SoC. The SoC may generate a command and a code synchronized with the first clock, and may train a duty cycle of a third clock which is generated within the memory device based on the second clock and is used for a data input/output of the memory device, by sending the command and the code to the memory device.

DETAILED DESCRIPTION

Below, various embodiments of the inventive concept will be described in detail and clearly to such an extent that an ordinary one in the art easily implements the inventive concept. These embodiments are all exemplary, and thus, the inventive concept is not limited thereto, and may be realized in various other forms. An embodiment provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

Figure 1:
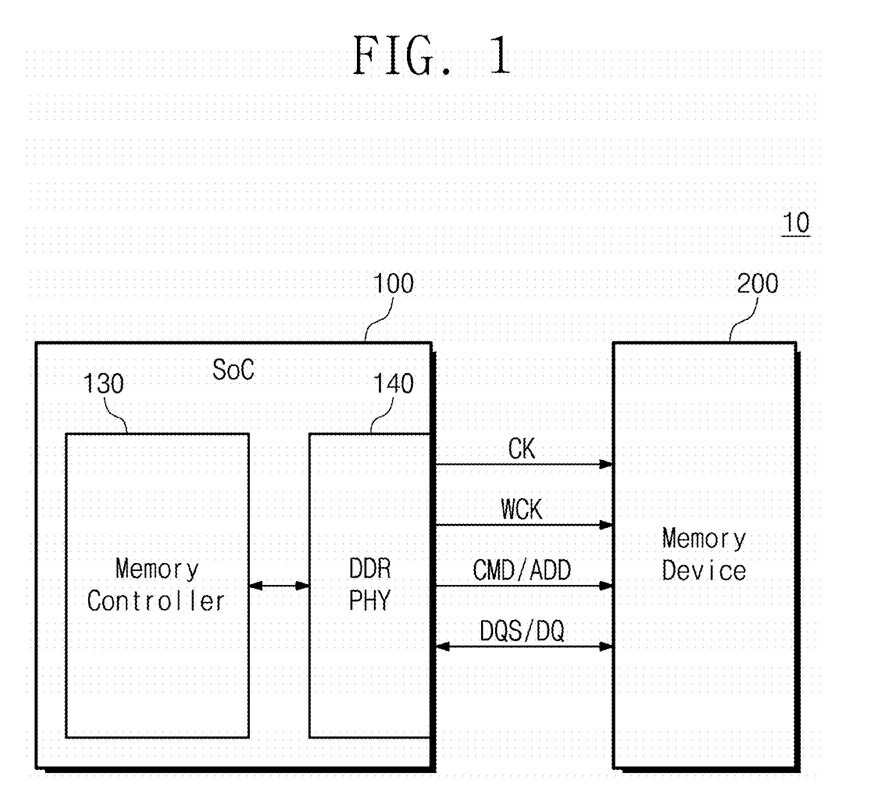
FIG. 1 illustrates a block diagram of an electronic device according to an embodiment.

FIG. 1 illustrates a block diagram of an electronic device according to an embodiment. An electronic device 10 may include a system on chip (SoC) 100 and a memory device 200. The electronic device 10 may be also referred to as an "electronic system". For example, the electronic device 10 may be a desktop computer, a laptop computer, a workstation, a server, a mobile device, etc.

The SoC 100 which is an application processor (AP) may control overall operations of the electronic device 10. The SoC 100 may execute a program according to an application which the electronic device 10 supports, and may receive data associated with program execution from the memory device 200, or may send a result of the program execution to the memory device 200. The SoC 100 may include various intellectual properties (IPs). For example, SoC 100 may include a memory controller 130 and a double data rate physical layer (DDR PHY) 140.

The memory controller 130 may control the memory device 200 through the DDR PHY 140. The memory controller 130 may generate commands and addresses for accessing the memory device 200. The memory controller 130 may generate data to be stored to the memory device 200. The memory controller 130 may receive data stored in the memory device 200.

The DDR PHY 140 may be also referred to as a "DDR PHY interface". The DDR PHY 140 may send a clock CK, a write clock WCK, and a command and address CMD/ADD to the memory device 200 under control of the memory controller 130. The DDR PHY 140 may send a data strobe signal (hereinafter referred to as a "DQS") and a data input/output signal (hereinafter referred to as a "DQ") to the memory device 200 under control of the memory controller 130. The DQS may be used to sample the DQ. The DDR PHY 140 may receive the DQS and the DQ from the memory device 200. Paths which are used to send the DQS and the DQ from DDR PHY 140 to the memory device 200 and paths which are used to send the DQS and the DQ from the memory device 200 to the DDR PHY 140 may be the same, and may be shared. Since the DQS and the DQ are bidirectional signals, the DQS and the DQ which are output from the SoC 100 to the memory device 200 may be referred to as a write DQS and a write DQ, respectively, and the DQS and the DQ which are output from the memory device 200 to the SoC 100 may be referred to as a read DQS and a read DQ, respectively.

Depending on a request from the SoC 100, the memory device 200 may store data or may provide data stored therein to the SoC 100. The memory device 200 may communicate with the SoC 100 through DDR PHY 140. For example, the memory device 200 may be a dynamic random access memory (DRAM) device, a static random access memory (SRAM) device, a thyristor random access memory (TRAM) device, a NAND flash memory device, a NOR flash memory device, a resistive random access memory (RRAM) device, a ferroelectric random access memory (FRAM) device, a phase change random access memory (PRAM) device, a magnetic random access memory (MRAM) device, a solid state drive (SSD), a memory card, universal flash storage (UFS), etc. Below, a description will be given as the memory device 200 is a DRAM device synchronized with the clock CK output from the SoC 100 (i.e., a synchronous dynamic random access memory (SDRAM) device). In particular, the memory device 200 may be a low power double data rate 5 (LPDDR5) SDRAM.

For a high-speed data input/output with the memory device 200, the SoC 100 may provide the write clock WCK to the memory device 200 in addition to the clock CK. The memory device 200 may sample a command and address CMD/ADD by using the clock CK. The memory device 200 may perform a high-speed data input/output by using the write clock WCK. That is, the memory device 200 may receive the write DQS and the write DQ by using the write clock WCK, and may output the read DQS and the read DQ to the SoC 100 by using the write clock WCK.

A frequency of the write clock WCK may be higher than a frequency of the clock CK (e.g., an integer multiple of a frequency of the clock CK). The SoC 100 may always send the clock CK having a relatively low frequency to the memory device 200, and may also send the write clock WCK having a relatively high frequency to the memory device 200 only during a data input/output interval. The data input/output interval may be referred to as a data input/output time or a data input/output period. Since the frequency of the write clock WCK is higher than the frequency of the clock CK and is used for the high-speed data input/output, it is necessary to adjust a duty cycle of the write clock WCK to an ideal value (i.e., to perform training of a duty cycle of the write clock WCK). The ideal value may be 50% (i.e., a duration corresponding to logic "1" of the clock CK may be identical to a duration corresponding to logic "0" of the clock CK).

In detail, a plurality of SoCs 100 may be manufactured through manufacturing processes, and a plurality of memory devices 200 may be manufactured of different manufacturing processes. The plurality of SoCs 100 may be characterized by various types of operating characteristics (operating speed, power consumption, etc.), and the plurality of memory devices 200 may be also characterized by various types of operating characteristics. One of the plurality of SoCs 100 and one of the plurality of memory devices 200 may be mounted on or used in the electronic device 10. Since each of the SoC 100 and the memory device 200 has various operating characteristics (e.g., fast, typical, slow, etc.), training of a duty cycle of the high-speed write clock WCK which is provided from the SoC 100 to the memory device 200 is necessary (i.e., training of an on the fly manner). In particular, training of a duty cycle of an internal write clock IWCK which is generated in the memory device 200 receiving the write clock WCK is necessary.

Figure 2:
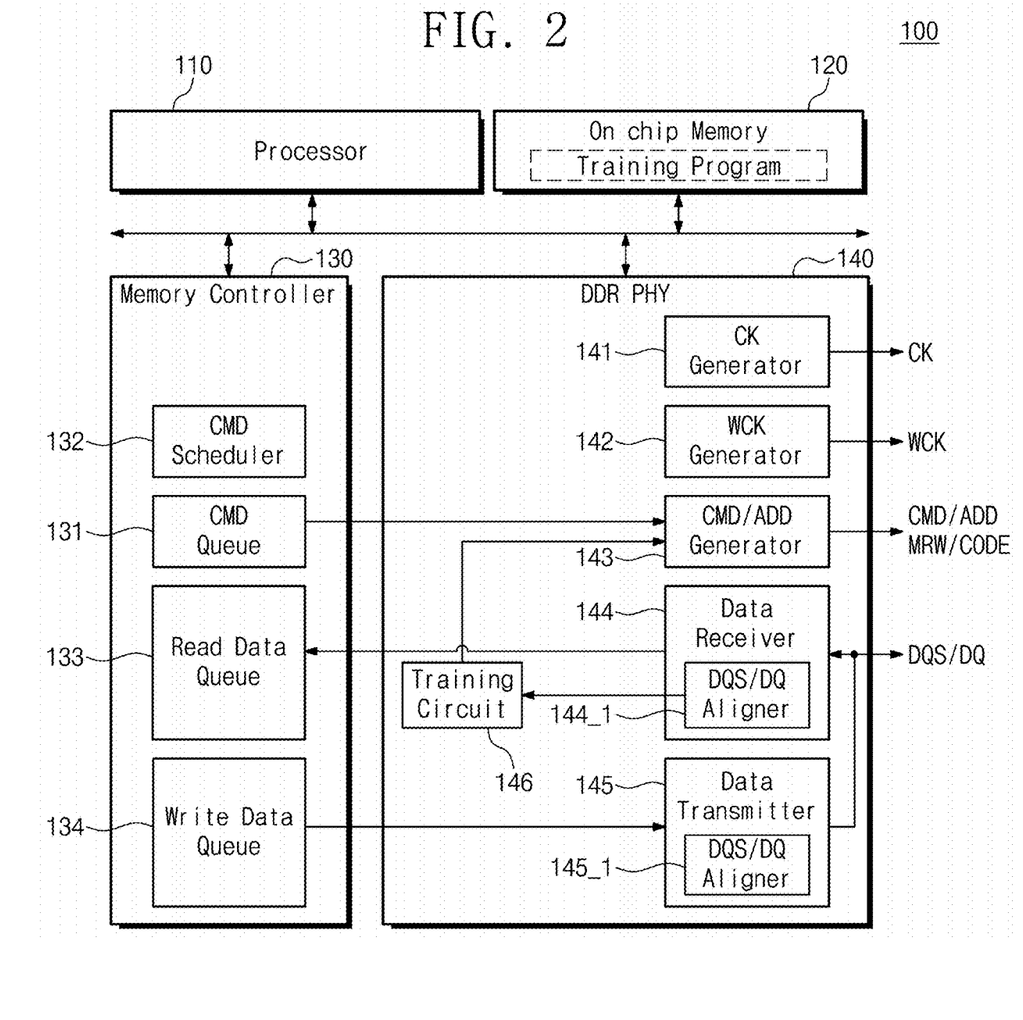
FIG. 2 illustrates a block diagram of a system on chip (SoC) of FIG. 1, according to an embodiment.

FIG. 2 illustrates a block diagram of an SoC of FIG. 1. The SoC 100 may further include a processor 110 and an on chip memory 120 in addition to the memory controller 130 and the DDR PHY 140.

The processor 110 may execute various software programs (e.g., an application program, an operating system, a file system, and a device driver) loaded on the on chip memory 120. Referring to FIG. 2, the processor 110 may execute a training program loaded on the on chip memory 120. The processor 110 may include homogeneous multi-core processors or heterogeneous multi-core processors. For example, the processor 110 may include at least one of a central processing unit (CPU), an image signal processing unit (ISP), a digital signal processing unit (DSP), a graphics processing unit (GPU), a vision processing unit (VPU), and a neural processing unit (NPU).

An application program, an operating system, a file system, a device driver, etc. for driving the electronic device 10 may be loaded on the on chip memory 120. In particular, referring to FIG. 2, the training program may be loaded on the on chip memory 120. For example, the on chip memory 120 may be a cache, registers, a tightly coupled memory (TCM), an SRAM, etc. The on chip memory 120 may be implemented within the SoC 100, and may have faster data input/output speed than the memory device 200. The on chip memory 120 may be referred to as a "buffer memory".

The memory controller 130 may access the memory device 200 in a direct memory access (DMA) manner. The memory controller 130 may include a command queue 131, a command scheduler 132, a read data queue 133, and a write data queue 134.

The command queue 131 may store commands and addresses generated by the processor 110. A command and an address stored in the command queue 131 may be provided to the DDR PHY 140 under control of the command scheduler 132. In this case, one or more commands and one or more addresses stored in the command queue 131 may be provided to the DDR PHY 140 in parallel. The command scheduler 132 may adjust an order of commands and addresses stored in the command queue 131, a time point when a command(s) and an address(es) are input to the command queue 131, a time point when a command(s) and an address(es) are output from the command queue 131, etc.

The read data queue 133 may store read data sent from the memory device 200 through the DDR PHY 140 depending on a read request from the SoC 100 with respect to the memory device 200. The read data stored in the read data queue 133 may be provided to the on chip memory 120 and processed by the processor 110. The write data queue 134 may store write data to be stored to the memory device 200. Write data stored in the write data queue 134 depending on a write request from the SoC 100 with respect to the memory device 200 may be sent to the memory device 200 through the DDR PHY 140. For example, the command queue 131, the command scheduler 132, the read data queue 133, and the write data queue 134 of the memory controller 130 may be implemented within the SoC 100 in the form of hardware or software or in the form of a combination of hardware and software.

The DDR PHY 140 may include a clock generator 141, a write clock generator 142, a command and address generator 143, a data receiver 144, a data transmitter 145, and a training circuit 146. The clock generator 141, the write clock generator 142, the command and address generator 143, the data receiver 144, the data transmitter 145, and the training circuit 146 of the DDR PHY 140 may be implemented within the SoC 100 in the form of hardware or software or in the form of a combination of hardware and software.

The clock generator 141 may generate the clock CK which is output to the memory device 200. Unlike illustration of FIG. 2, the clock generator 141 may generate differential clocks CK_t and CK_c, and may send the clocks CK_t and CK_c to the memory device 200. The write clock generator 142 may generate the write clock WCK which is output to the memory device 200. Unlike illustration of FIG. 2, the write clock generator 142 may generate differential write clocks WCK_t and WCK_c, and may send the write clocks WCK_t and WCK_c to the memory device 200. Although not illustrated in FIG. 2, the clock generator 141 may include a duty cycle corrector (DCC) or a duty cycle adjuster (DCA) which corrects (or adjusts) a duty cycle of the clock CK. The write clock generator 142 may also include the DCC or DCA which corrects (or adjusts) a duty cycle of the write clock WCK. Even though the write clock generator 142 includes the DCC, as described above, since the SoC 100 may have various operating characteristics (e.g., fast, typical, slow, etc.) and the memory device 200 may also have various operating characteristics (e.g., fast, typical, slow, etc.), the training of the duty cycle of the write clock WCK is required.

The command and address generator 143 may receive a command or an address from the command queue 131, and may send the command or the address to the memory device 200. For example, the number of command and address transmission paths between the command and address generator 143 and the memory device 200, logical states of signals to be sent through the above-described transmission paths, a way to send, etc. may be defined in the JEDEC standard of the memory device 200.

The data receiver 144 may receive read data from the memory device 200. The data receiver 144 may provide the received read data to the read data queue 133. The data receiver 144 may include a read DQS/DQ aligner 144_1 which aligns the read DQS and the read DQ or adjusts a skew between the read DQS and the read DQ. The read DQS/DQ aligner 144_1 may include a delay locked loop (DLL) which includes a plurality of delay cells. For example, the read DQS/DQ aligner 144_1 may find an optimum sampling point for determining the read DQ at the SoC 100 while delaying the read DQS or the read DQ based on a time unit corresponding to a delay time of one delay cell.

The data transmitter 145 may receive write data from the write data queue 134. The data transmitter 145 may send the received write data to the memory device 200. The data transmitter 145 may include a write DQS/DQ aligner 145_1 which aligns the write DQS and the write DQ or adjusts a skew between the write DQS and the write DQ. The write DQS/DQ aligner 145_1 may also include a DLL which includes a plurality of delay cells. The write DQS/DQ aligner 145_1 may find an optimum sampling point for determining the write DQ at the memory device 200 while delaying the write DQS or the write DQ based on a time unit corresponding to a delay time of one delay cell.

The training circuit 146 may operate under control of the training program which is executed by the processor 110 and stored in the on chip memory 120. The training circuit 146 may receive the aligned read DQS and the aligned read DQ from the read DQS/DQ aligner 144_1 of the data receiver 144, and may calculate a valid window margin (VWM). The VWM may mean a maximum interval in which the data receiver 144 can determine the read DQ output from the memory device 200 by using the read DQS output from the memory device 200. The VWM may indicate an interval in which the read DQ can be validly sampled with respect to the read DQS. The VWM will be described with reference to FIG. 3. The training circuit 146 may store the calculated VWM to the on chip memory 120.

The training circuit 146 may adjust, change, or calibrate a code under control of the training program. The training circuit 146 may control the command and address generator 143 under control of the training program. For example, the command and address generator 143 may generate a read command, a write command, test data, etc. for training depending on a test pattern of the training program, which is determined in advance, and may send the read command, the write command, the test data, etc. to the memory device 200.

In detail, the training circuit 146 may control the command and address generator 143 so that the command and address generator 143 outputs a mode register write command MRW and a code to the memory device 200. The training circuit 146 may provide a value of the code to the command and address generator 143. The mode register write command MRW may be a command for writing a code to mode registers (to be described with reference to FIG. 4) in the memory device 200. The training circuit 146 may set an operating mode of the memory device 200 by changing a code or a value of the code stored in the mode registers of the memory device 200 through the mode register write command MRW.

Figure 3:
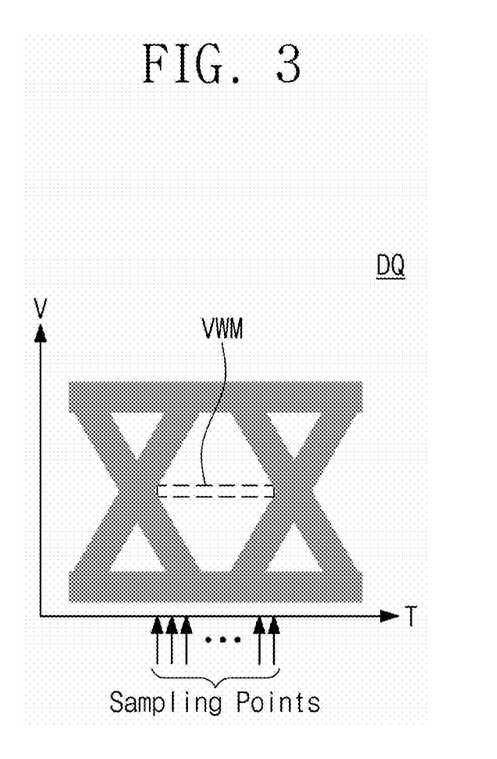
FIG. 3 illustrates a valid window margin (VWM) calculated by a training circuit of FIG. 2, according to an embodiment.

FIG. 3 illustrates a VWM calculated by a training circuit of FIG. 2. In FIG. 3, a horizontal axis represents a time "T", and a vertical axis represents a voltage level "V". In FIG. 3, a shaded portion may indicate an eye diagram (or an eye pattern) of the read DQ.

As described above, the training circuit 146 may calculate the VWM of the read DQ. The training circuit 146 may change a time point to determine the read DQ, that is, a sampling point while delaying the read DQS or the read DQ. The training circuit 146 may find valid sampling points at which the read DQ can be validly sampled, among a plurality of sampling points, and may calculate the VWM of the read DQ from the valid sampling points. For example, all sampling points illustrated in FIG. 3 may be valid sampling points. The training circuit 146 may calculate a difference between two valid sampling points or a value smaller than the difference as the VWM of the read DQ.

Figure 4:
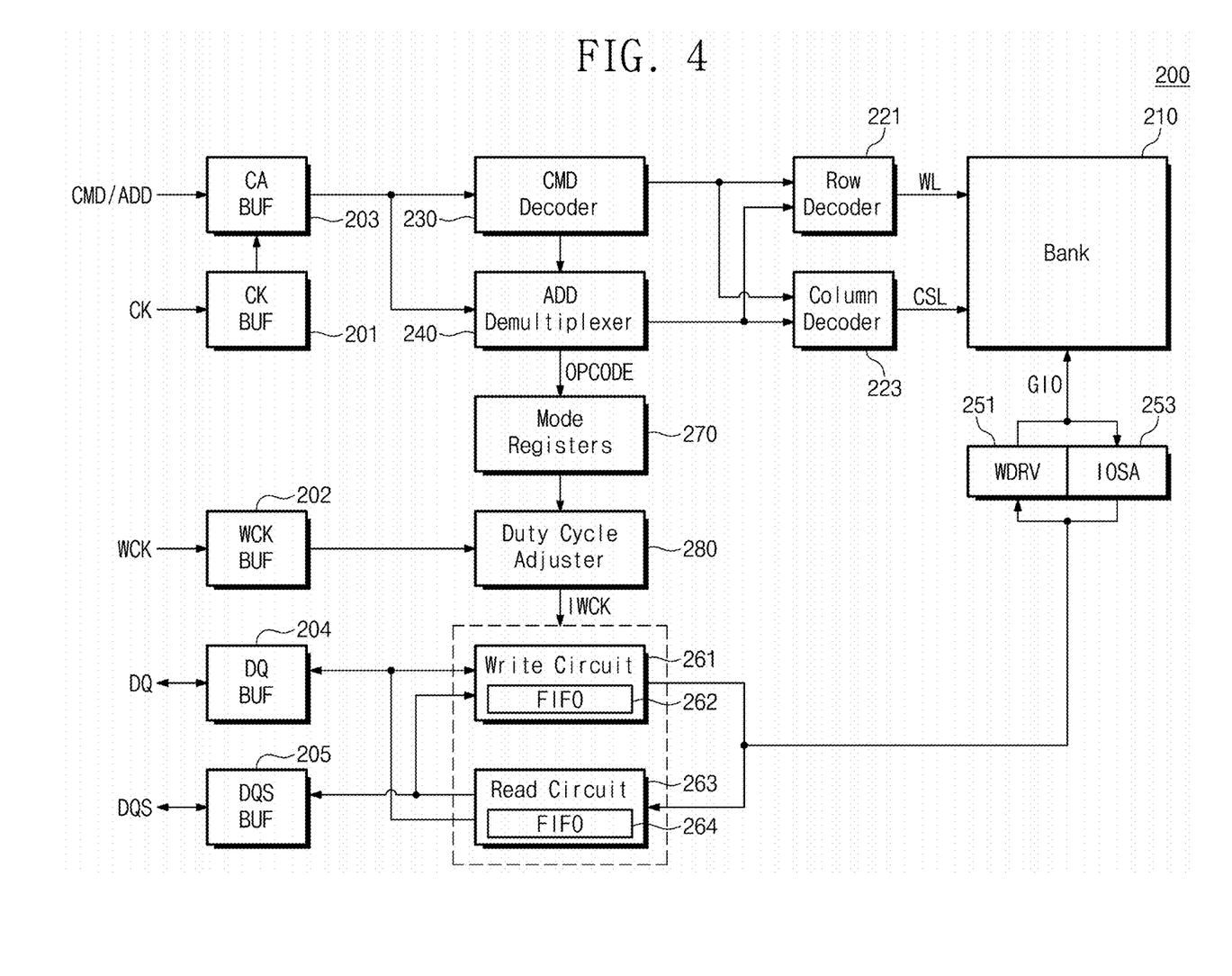
FIG. 4 illustrates a block diagram of a memory device of FIG. 1, according to an embodiment.

FIG. 4 illustrates a block diagram of a memory device of FIG. 1. The memory device 200 may include a CK buffer 201, a WCK buffer 202, a CA buffer 203, a DQ buffer 204, a DQS buffer 205, a bank 210, a row decoder 221, a column decoder 223, a command decoder 230, an address demultiplexer 240, a write driver 251, an input/output sense amplifier 253, a write circuit 261, a read circuit 263, mode registers 270, and a duty cycle adjuster (DCA) 280. All the above-described components may be implemented within the memory device 200 in the form of hardware.

The CK buffer 201 may receive the clock CK from the SoC 100. The CK buffer 201 may provide the received clock CK to internal components of the memory device 200. As described above, the SoC 100 may send the differential clocks CK_t and CK_c to the memory device 200, and the memory device 200 may include the CK buffers 201 receiving the clocks CK_t and CK_c, respectively.

The WCK buffer 202 may receive the write clock WCK from the SoC 100. The WCK buffer 202 may provide the received write clock WCK to the write circuit 261 and the read circuit 263. As described above, the SoC 100 may send the differential write clocks WCK_t and WCK_c to the memory device 200, and the memory device 200 may include the WCK buffers 202 receiving the write clocks WCK_t and WCK_c, respectively.

The CA buffer 203 may receive the command and address CMD/ADD from the SoC 100 based on the clock CK received through the CK buffer 201. The CA buffer 203 may sample the command and address CMD/ADD by using the clock CK. That is, the memory device 200 may be synchronized with the clock CK. The CA buffer 203 may provide the sampled command and address CMD/ADD to the command decoder 230 or the address demultiplexer 240.

The DQ buffer 204 may receive the write DQ from the SoC 100 and may output the read DQ to the SoC 100. Since the DQ is a bidirectional signal, the DQ buffer 204 may include both a receiver (not illustrated) receiving the write DQ and a transmitter (not illustrated) outputting the read DQ. The DQS buffer 205 may receive the write DQS from the SoC 100 and may output the read DQS to the SoC 100. Since the DQS is a bidirectional signal, the DQS buffer 205 may include both a receiver (not illustrated) receiving the write DQS and a transmitter (not illustrated) outputting the read DQS.

In an embodiment, the number of the buffers 201 to 205 of the memory device 200 is not limited to an example illustrated in FIG. 4. The number of the buffers 201 to 205 may be determined according to a capacity, an operating speed, a bandwidth, etc. of the memory device 200.

The bank 210 may include a memory cell array. The memory cell array may include memory cells connected to word lines and bit lines (not illustrated). The number of memory cells of the bank 210 may be determined according to a capacity of the bank 210, and the number of banks 210 may be determined according to a capacity of the memory device 200.

The row decoder 221 may decode a row address under control of the command decoder 230. The row decoder 221 may select or activate at least one word line corresponding to the row address. The column decoder 223 may decode a column address under control of the command decoder 230. The column decoder 223 may select or activate at least one column selection line corresponding to the column address. Two or more bit lines may be connected to a column selection line. For example, memory cells corresponding to the row address and the column address may be selected, and a data input/output may be performed on the selected memory cells.

The command decoder 230 may decode a command output from the DDR PHY 140 of the SoC 100, and may control internal components of the memory device 200. For example, the command decoder 230 may decode an activate command, a read command, a write command, a precharge command, a mode register write command, a multi-purpose command (MPC), etc. All the above-described commands may be determined in advance according to the JEDEC standard.

The address demultiplexer 240 may provide the address ADD received together with the command to internal components of the memory device 200 under control of the command decoder 230. The address demultiplexer 240 may provide an address sent together with the precharge command or the activate command from the SoC 100 to the row decoder 221 as a row address. The address demultiplexer 240 may provide an address sent together with the read command or the write command from the SoC 100 to the column decoder 223 as a column address.

The address demultiplexer 240 may provide an address sent together with a mode register write command from the SoC 100 to the mode registers 270 as a code. Here, the code may be sent through command and address transmission paths between the SoC 100 and the memory device 200. Since the code is stored to the mode registers 270, the code may be referred to as an "operation code OPCODE" or an "operand".

The address demultiplexer 240 may provide an address sent together with the multi-purpose command to multi-purpose registers (not illustrated), a first-in first-out (FIFO) 262, or a FIFO 264 of the memory device 200. The above-described commands and addresses may be defined according to the JEDEC standard of the memory device 200. In an embodiment, an address sent together with a command may include an address of memory cells of the memory device 200, may include a code to be used to set an operating mode of the memory device 200, or may include test data for training to be stored to the FIFO 262 or the FIFO 264, not to the bank 210.

The write driver 251 may receive write data from the write circuit 261, and may write the write data to selected memory cells through an input/output line GIO under control of the command decoder 230. The input/output sense amplifier 253 may sense read data output from the selected memory cells through the input/output line GIO, and may provide the read data to the read circuit 263.

The write circuit 261 may receive the write DQS and the write DQ from the SoC 100 through the DQS buffer 205 and the DQ buffer 204. The write circuit 261 may sample or deserialize the write DQ by using the write DQS, and may store a result of the sampling to the FIFO 262. The write circuit 261 may provide the write data stored in the FIFO 262 to the write driver 251. The write circuit 261 may operate based on the internal write clock IWCK. The read circuit 263 may receive read data from the input/output sense amplifier 253. The read circuit 263 may store the received read data to the FIFO 264. The read circuit 263 may serialize the read data, and may send the read DQS and the read DQ to the SoC 100 through the DQS buffer 205 and the DQ buffer 204. The read circuit 263 may operate based on the internal write clock IWCK. The memory device 200 may operate in synchronization with the write clock WCK or the internal write clock IWCK.

In an embodiment, the read circuit 263 may store an address sent together with the read command, the multi-purpose command, etc. from the SoC 100 to the FIFO 264, under control of the command decoder 230 decoding the read command, the multi-purpose command, etc. In this case, the address stored in the FIFO 264 may be output to the SoC 100 as data, and may not be stored to the bank 210. Afterwards, the read circuit 263 may output the address stored in the FIFO 264 to the SoC 100 as data, under control of the command decoder 230 decoding the read command.

The mode registers 270 may store the code provided from the address demultiplexer 240. The number of the mode registers 270, an address, a code size, etc. may be defined according to the JEDEC standard. By issuing the mode register write command and the code, the SoC 100 may change values stored in the mode registers 270 to set an operating condition, an operating mode, etc. of the memory device 200.

The duty cycle adjuster 280 may receive the write clock WCK through the WCK buffer 202 to generate the internal write clock IWCK. The internal write clock IWCK may be a signal which is generated by buffering or amplifying the write clock WCK within the memory device 200, may be substantially identical to the write clock WCK, and may be used for the data input/output of the memory device 200. The internal write clock IWCK is a signal output from the WCK buffer 202 of the memory device 200, and the write clock WCK is a signal input to the WCK buffer 202 of the memory device 200. The duty cycle adjuster 280 may adjust a duty cycle of the internal write clock IWCK depending on a value of the code stored in the mode registers 270. The duty cycle adjuster 280 may adjust the duty cycle of the internal write clock IWCK, not the write clock WCK outside the memory device 200.

Table 1 below shows that the duty cycle adjuster 280 adjusts a duty cycle of the internal write clock IWCK depending on a value of a code OP[n:0] (n being a natural number) stored in the mode registers 270. In Table 1, a type of the DCA is "W", and "W" indicates a write operation associated with the mode registers 270. In Table 1, the code OP[n:0] is a 4-bit code, but the inventive concept is not limited thereto.

TABLE 1

| Function | Type | OP | Data |
|---|---|---|---|
| DCA (DCAL: Duty Cycle Adjuster Lower Byte) | W | OP[3:0] | 0000b: 0 Steps (Default) |
| | | | 0001b: −1 Steps |
| | | | 0010b: −2 Steps |
| | | | 0011b: −3 Steps |
| | | | 0100b: −4 Steps |

TABLE 1-continued

| Function | Type | OP | Data |
|---|---|---|---|
| | | | 0101b: −5 Steps |
| | | | 0110b: −6 Steps |
| | | | 0111b: −7 Steps |
| | | | 1000b: RFU |
| | | | 1001b: +1 Steps |
| | | | 1010b: +2 Steps |
| | | | 1011b: +3 Steps |
| | | | 1100b: +4 Steps |
| | | | 1101b: +5 Steps |
| | | | 1110b: +6 Steps |
| | | | 1111b: +7 Steps |
| DCA (DCAU: Duty Cycle Adjuster Upper Byte) | W | OP[7:4] | 0000b: 0 Steps (Default) |
| | | | 0001b: −1 Steps |
| | | | 0010b: −2 Steps |
| | | | 0011b: −3 Steps |
| | | | 0100b: −4 Steps |
| | | | 0101b: −5 Steps |
| | | | 0110b: −6 Steps |
| | | | 0111b: −7 Steps |
| | | | 1000b: RFU |
| | | | 1001b: +1 Steps |
| | | | 1010b: +2 Steps |
| | | | 1011b: +3 Steps |
| | | | 1100b: +4 Steps |
| | | | 1101b: +5 Steps |
| | | | 1110b: +6 Steps |
| | | | 1111b: +7 Steps |

In the case where a DCA value corresponding to a code OP[3:0] stored in the mode registers 270 is "0000b", the duty cycle adjuster 280 may not adjust a duty cycle of the internal write clock IWCK or may adjust the duty cycle of the internal write clock IWCK to a default value. When the DCA value corresponding to the code OP[3:0] is changed to one of values from "0001b" to "0111b", the duty cycle adjuster 280 may decrease the duty cycle of the internal write clock IWCK from −1 step to −7 step. As in the above description, when the DCA value corresponding to the code OP[3:0] is changed to one of values from "1001b" to "1111b", the duty cycle adjuster 280 may increase the duty cycle of the internal write clock IWCK from +1 step to +7 step. A magnitude of a unit step of Table 1 may be determined in advance.

Figure 5:
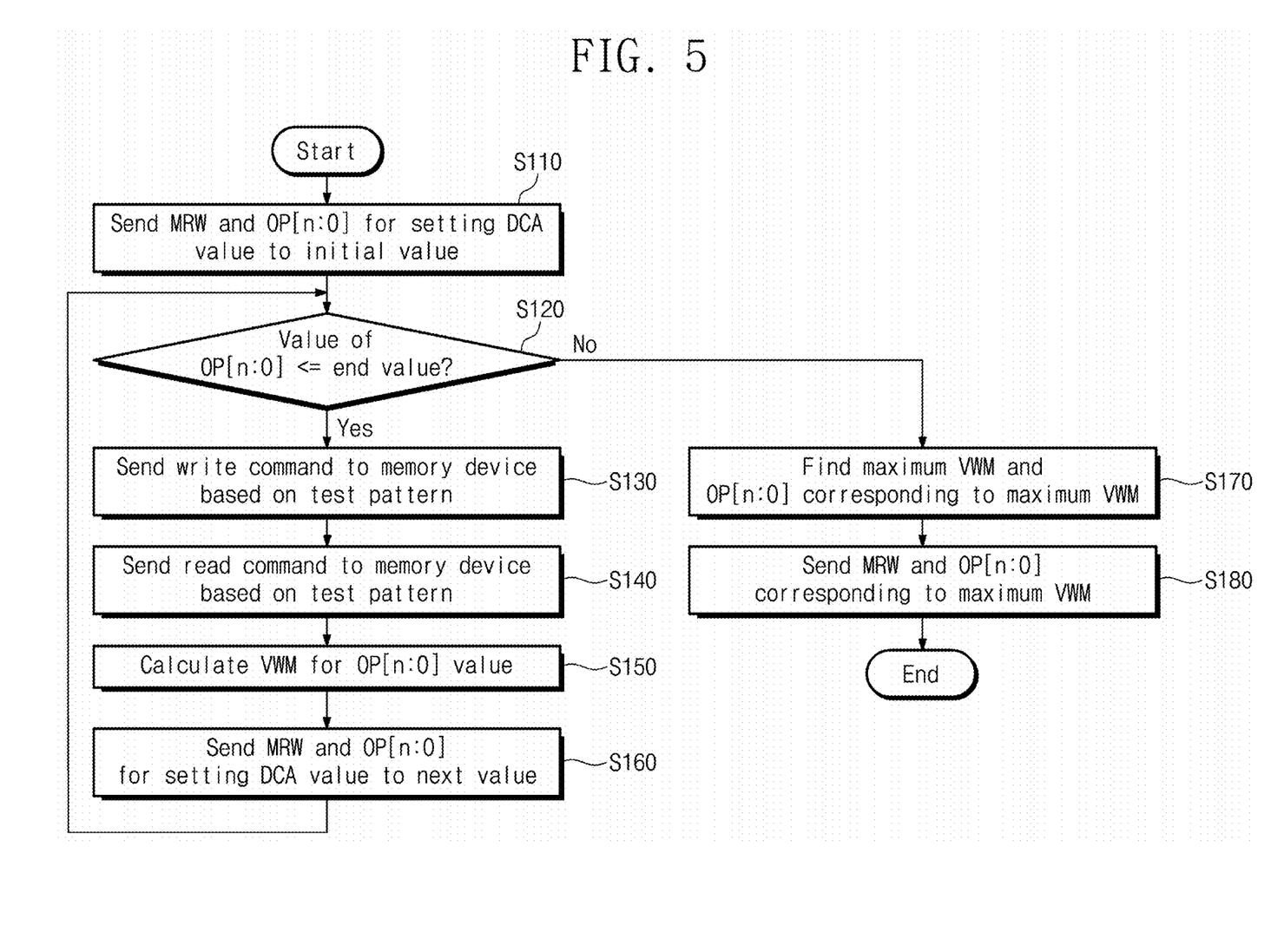
FIG. 5 illustrates a flowchart for finding a value corresponding to a maximum VWM among values of a code for adjusting a duty cycle of an internal write clock of a memory device at an SoC, according to an embodiment.

FIG. 5 illustrates a flowchart for finding a value corresponding to a maximum VWM among values of a code for adjusting a duty cycle of an internal write clock of a memory device at an SoC, according to an embodiment. FIG. 5 will be described with reference to FIGS. 1 to 4.

In operation S110, the SoC 100 may send a mode register write command and a code OP[n:0] for adjusting a duty cycle of the internal write clock IWCK of the memory device 200 to the memory device 200. The SoC 100 may set a DCA value of the mode registers 270 to an initial value (e.g., "0000b" in the case of Table 1) determined in advance. Here, the DCA value may be a value which is stored in the mode registers 270 by the mode register write command, and may be provided to the duty cycle adjuster 280. The duty cycle of the internal write clock IWCK may be set according to the code OP[n:0] having an initial code value.

In operation S120, the SoC 100 may determine whether a value of the code OP[n:0] exceeds an end value. The end value may be set in advance to any value (e.g., a maximum value or a minimum value of the code OP[n:0]) of values of the code OP[n:0]. Operation S120 may be repeatedly performed until VWMs associated with all values which the code OP[n:0] may have are calculated. If the value of the code OP[n:0] does not exceed the end value (Yes), operation S130 may be performed; if not (No), operation S170 may be performed. In operation S120 of FIG. 5, an inequality sign is only exemplary. That is, if VWMs associated with all values which the code OP[n:0] may have are not calculated, operation S130 may be performed; if not, operation S170 may be performed.

In operation S130, the SoC 100 may send a write command to the memory device 200 based on a test pattern. The test pattern may be determined in advance based on a test program stored in the on chip memory 120. For example, the data transmitter 145 may not operate when the write command is output from the SoC 100 depending on the test pattern. The command and address generator 143 may send the write command and test data determined in advance to the memory device 200 through the command and address transmission paths. The memory device 200 may decode the write command according to the test pattern, and may immediately store the test data determined in advance to the FIFO 264, not to the bank 210. The write command of the test pattern may be different from a write command for writing data to the bank 210 and may be the multi-purpose command.

In operation S140, the SoC 100 may send a read command to the memory device 200 based on the test pattern. The memory device 200 may output the test data stored in the FIFO 264 to the SoC 100 depending on the read command. The memory device 200 may output the read DQS and the read DQ to the SoC 100 based on the test data. The SoC 100 may receive a read DQS and a read DQ, as the mode register write command and the code OP[n:0] synchronized with the clock CK are sent to the memory device 200 in operation S160.

For example, when the value of the code OP[n:0] is changed, the read DQS/DQ aligner 144_1 may align the read DQS and the read DQ, for sampling. Although not illustrated in FIG. 5, in the case where the read DQS and the read DQ are not aligned, operation S150 may be omitted, and operation S160 may be performed. In the case where the read DQS and the read DQ are aligned, operation S150 may be performed.

In operation S150, the SoC 100 may calculate a VWM associated with the value of the code OP[n:0] based on the read DQS and the read DQ aligned by the read DQS/DQ aligner 144_1. For example, in the case where operation S150 is performed for the first time, a value of the code OP[n:0] may be an initial value. In the case where operation S150 is again performed, a value of the code OP[n:0] may be a next value. The VWMs associated with all values of the code OP[n:0] may be calculated in the above-described manner.

In operation S160, the SoC 100 may send the mode register write command, and the code OP[n:0] having the next value to the memory device 200. The SoC 100 may set or change a previous value of the code OP[n:0] to the next value. The SoC 100 may set a DCA value of the mode registers 270 to a next value. The SoC 100 may change a value of the code OP[n:0] in various manners. For example, the SoC 100 may sequentially increase or decrease a value of the code OP[n:0]. A difference between the previous value of the code OP[n:0] and the next value of the code OP[n:0] may be a value corresponding to a least significant bit (LSB) of the code OP[n:0]. A duty cycle of the internal write clock IWCK of the memory device 200 may be set according to the code OP[n:0] having the next value. As described with reference to Table 1, a difference (or a step) between the duty cycle of the internal write clock IWCK of the memory device 200 corresponding to the previous value of the code OP[n:0] and the duty cycle of the internal write clock IWCK of the memory device 200 corresponding to the next value of the code OP[n:0] may be a value which is determined in advance.

In operation S170, the SoC 100 may find a maximum VWM among the plurality of VWMs calculated by repeatedly performing operation S120 to operation S160. Here, the plurality of VWMs may be stored to the on chip memory 120 of the SoC 100.

In operation S180, the SoC 100 may send the mode register write command and a target value of the code OP[n:0] corresponding to the maximum VWM to the memory device 200. The target value of the code OP[n:0] may be stored to the mode registers 270, and may be provided to the duty cycle adjuster 280. Accordingly, the duty cycle of the internal write clock IWCK of the memory device 200 may be set or adjusted according to the target value of the code OP[n:0]. In an embodiment, although not illustrated in drawings, after operation S180, the SoC 100 may again align the read DQS and the read DQ in the duty cycle of the internal write clock IWCK of the memory device 200 corresponding to the target value of the code OP[n:0].

Figure 6:
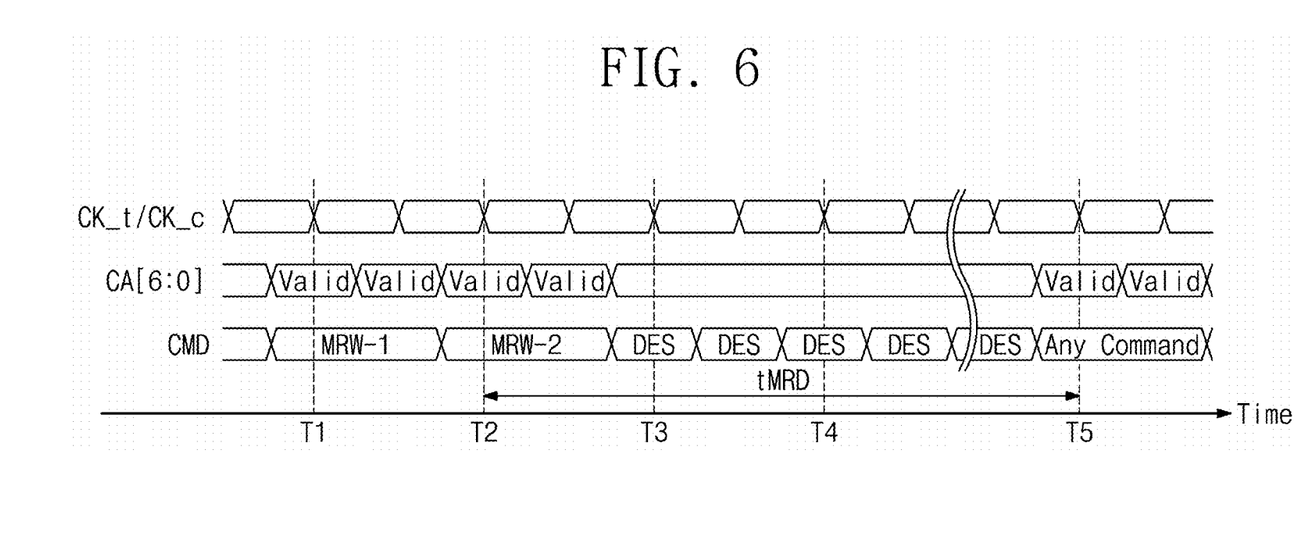
FIG. 6 illustrates a timing diagram in which an SoC sends a mode register write command and a code to a memory device in operation S160 of FIG. 5, according to an embodiment.

FIG. 6 illustrates a timing diagram in which an SoC sends a mode register write command and a code to a memory device in operation S160 of FIG. 5. Table 2 below shows an example of an MRW-1 command and an MRW-2 command at time points T1 and T2 of FIG. 6. FIG. 6 and Table 2 will be described together. For example, an interval between any time points of time points T1 to T5 may be an integer multiple of one period of the clock CK.

TABLE 2

| COMMAND | CA[0] | CA[1] | CA[2] | CA[3] | CA[4] | CA[5] | CA[6] | Edge |
|---|---|---|---|---|---|---|---|---|
| MRW-1 | L | L | L | H | L | L | OP[7] | Rising |
|  | OP[0] | OP[1] | OP[2] | OP[3] | OP[4] | OP[5] | OP[6] | Falling |
| MRW-2 | L | L | L | H | H | L | L | Rising |
|  | MA[0] | MA[1] | MA[2] | MA[3] | MA[4] | MA[5] | MA[6] | Falling |

The SoC 100 may send a mode register write command to the memory device 200 by issuing the MRW-1 command at the time point T1 and issuing the MRW-2 command at the time point T2. The MRW-1 command may include a value of the code OP[7:0], and the MRW-2 command may include a value of an address MA[6:0] indicating any registers of the mode registers 270 in which the value of the code OP[7:0] included in the MRW-1 command will be written. In FIG. 6 and Table 2, it is assumed that the number of command and address transmission lines between the SoC 100 and the memory device 200 is 7 (i.e., CA[6:0]), the number of bits of the code OP[n:0] for adjusting the duty cycle of the internal write clock IWCK of the memory device 200 is 8 (i.e., OP[7:0]), and an address of the mode registers 270, at which the code OP[7:0] is stored, is MA[6:0], but the inventive concept is not limited thereto. For example, MA[6:

0] may be 1E$_H$ (i.e., MR30). In Table 2, "L" and "H" indicate logic 0 and logic 1, respectively.

When the SoC 100 issues the MRW-1 command as defined in Table 2, the command decoder 230 may decode logical states "L", "L", "H", "L", "L", and "L" of the CA[5:0] at a rising edge of the clock CK_t. The address demultiplexer 240 may store a logical state of CA[6] at a rising edge of the clock CK_t and logical states of CA[6:0] at a falling edge of the clock CK_t as a value of the code OP[7:0] under control of the command decoder 230.

When the SoC 100 issues the MRW-2 command as defined in Table 2, the command decoder 230 may decode logical states "L", "L", "H", "H", "L", "L", and "L" of the CA[6:0] at a rising edge of the clock CK_t. The address demultiplexer 240 may store logical states of CA[6:0] at a falling edge of the clock CK_t as an address MA[6:0] of mode registers, at which a value of the code OP[7:0] included in the MRW-1 command is to be stored, from among the mode registers 270 under control of the command decoder 230. The address demultiplexer 240 may store a value of the code OP[7:0] included in the MRW-1 command to mode registers corresponding to the address MA[6:0] included in the MRW-2 command. Afterwards, the duty cycle adjuster 280 may adjust the duty cycle of the internal write clock IWCK depending on a DCA value corresponding to the value of the code OP[7:0] included in the MRW-1 command.

When a time of tMOD passes after the MRW-1 command and the MRW-2 command are issued, the SoC 100 may further send another command to the memory device 200. For example, the other command may include the write command, the multi-purpose command, the read command, etc. of operation S130 and operation S140.

Figure 7:
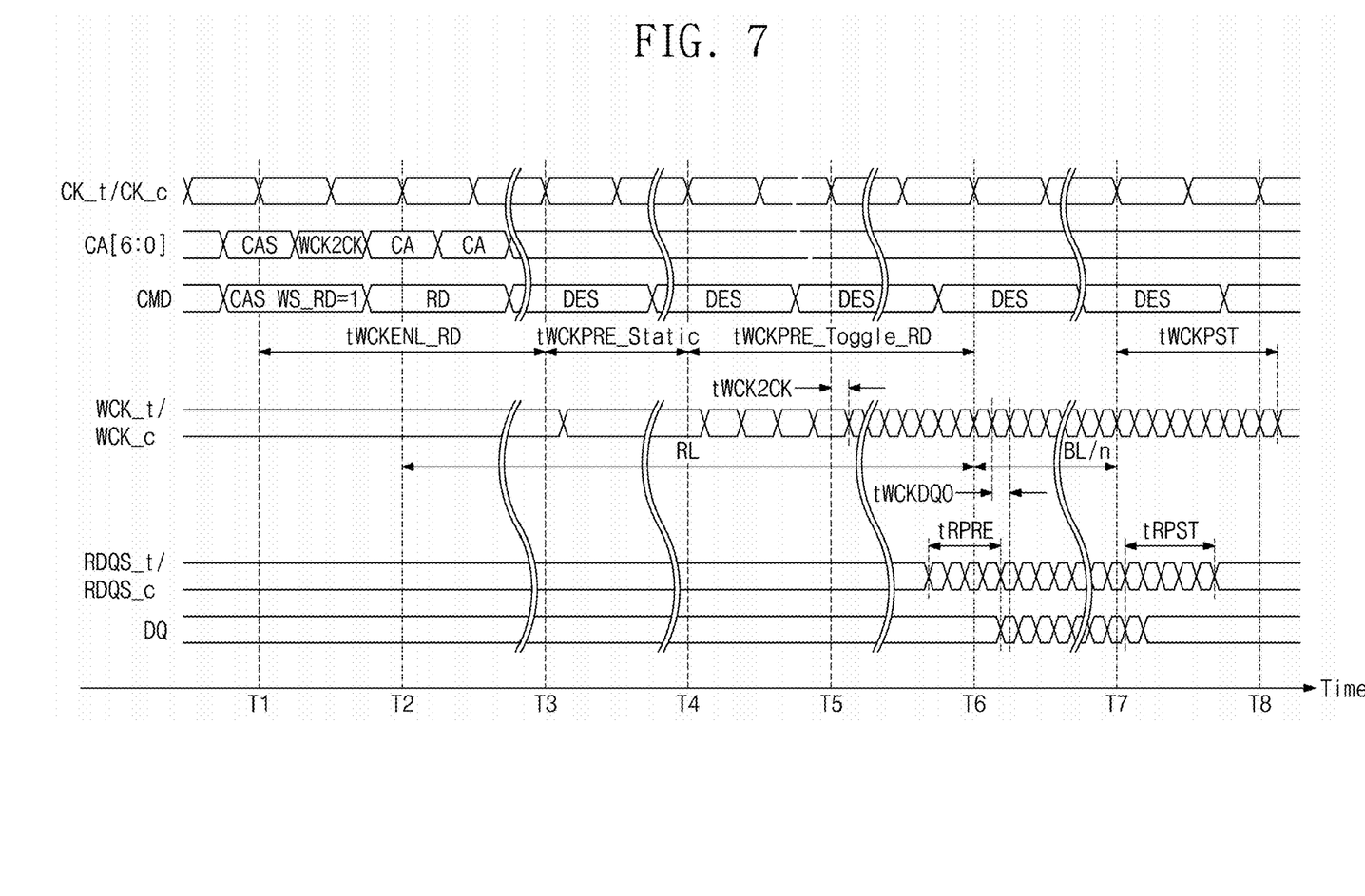
FIG. 7 illustrates a timing diagram in which an SoC sends a read command to a memory device in operation S140 of FIG. 5, according to an embodiment.

FIG. 7 illustrates a timing diagram in which an SoC sends a read command to a memory device in operation S140 of FIG. 5. In FIG. 7, it is assumed that the number of command and address transmission lines between the SoC 100 and the memory device 200 is 7 (i.e., CA[6:0]). In FIG. 7, the read DQS is illustrated by RDQS_t and RDQS_c. For example, an interval between any time points of time points T1 to T8 may be an integer multiple of one period of the clock CK.

The SoC 100 may issue a CAS (WS_RD) command for synchronization between the write clock WCK and the clock CK at a time point T1 before issuing a read command. For example, any bit of the CAS (WS_RD) command may be a WCK2CK synchronization bit. The CAS (WS_RD=1) means that a read command follows the CAS (WS_RD) command immediately. The SoC 100 may issue a read command immediately at a time point T2 after the time point T1. Since the write clock WCK is mainly used for the data input/output of the memory device 200, the SoC 100 may provide the write clock WCK to the memory device 200 only after sending a write command or a read command to the memory device 200, and may not provide the write clock WCK to the memory device 200 anymore after the data input/output is completed. Accordingly, synchronization between the write clock WCK and the clock CK is required.

Referring to FIG. 7, the SoC 100 may start to drive logical states of the write clocks WCK_t and WCK_c as logic 0 and logic 1 after a time passes from the time point T1 as much as tWCKEN_RD (i.e., from a time point T3). A WCK2CK synchronization operation may start after a time passes from the time T1 as much as "tWCKEN_RD+tWCKPRE_static" (i.e., from a time point T4). The SoC 100 may drive the write clocks WCK_t and WCK_c during "tWCKPRE_static+tWCKPRE_Toggle_RD" (i.e., during a time interval from T3 to T6) before read data are output. The SoC 100 may maintain logical states of the write clocks WCK_t and WCK_c during "tWCKPRE_static", and may allow the logical states of the write clocks WCK_t and WCK_c to toggle during "tWCKPRE_Toggle_RD".

The SoC 100 may also drive the write clocks WCK_t and WCK_c while read data are output. The SoC 100 may drive the write clocks WCK_t and WCK_c during "tWCKPST" from a time point T7 even though read data are completely output. The SoC 100 may stop driving the write clocks WCK_t and WCK_c when read data are completely output and a time passes as much as "tWCKPST" (after a time point T8). An example is illustrated in FIG. 7 as a frequency of the write clocks WCK_t and WCK_c is four times a frequency of the clocks CK_t and CK_c, but the inventive concept is not limited thereto.

tWCK2CK may indicate a skew (or a phase offset) between the write clock WCK and the clock CK. A range of tWCK2CK may be defined in advance according to the JEDEC standard. When tWCK2CK is adjusted within the range determined in advance, the WCK2CK synchronization operation may be completed. The memory device 200 may enter a WCK2CK synchronization state, and this state may be maintained until the memory device 200 completes outputting the read DQS and the read DQ.

The read DQ may be output after the SoC 100 issues a read command at the time point T2 and a time corresponding to a read latency RL passes, that is, during a time interval from the time point T6 to a time point T7. Here, BL may indicate a burst length (e.g., 16, 32, etc.), and "n" may be a natural number such as 4, 8, etc. tWCKDQO indicates an interval between the write clock WCK and the read DQS. tRPRE indicates a pre-amble interval for the read DQ, and tRPST indicates a post-amble interval for the read DQ. The memory device 200 may output the read DQS prior to a time corresponding to tRPRE before the read DQ is output, may next output the read DQ, and may then output the read DQS during tRPST.

In an embodiment, the memory device 200 may repeatedly receive a mode register write command at the time point T1 and the time point T2 of FIG. 6 (refer to operation S160). In the case where a value of the code OP[n:0] stored in the mode registers 270 is changed, a duty cycle of the internal write clock IWCK of the memory device 200 may also be changed. However, even though the read command is repeatedly sent at the time point T1 and the time point T2 of FIG. 7, the duty cycle of the write clocks WCK_t and WCK_c between the SoC 100 and the memory device 200 illustrated in FIG. 7 may not change. That is, in the case where a value of the code OP[n:0] stored in the mode registers 270 is changed, only the duty cycle of the internal write clock IWCK may be changed, and a duty cycle of the write clock WCK between the SoC 100 and the memory device 200 may not change.

Figure 8:
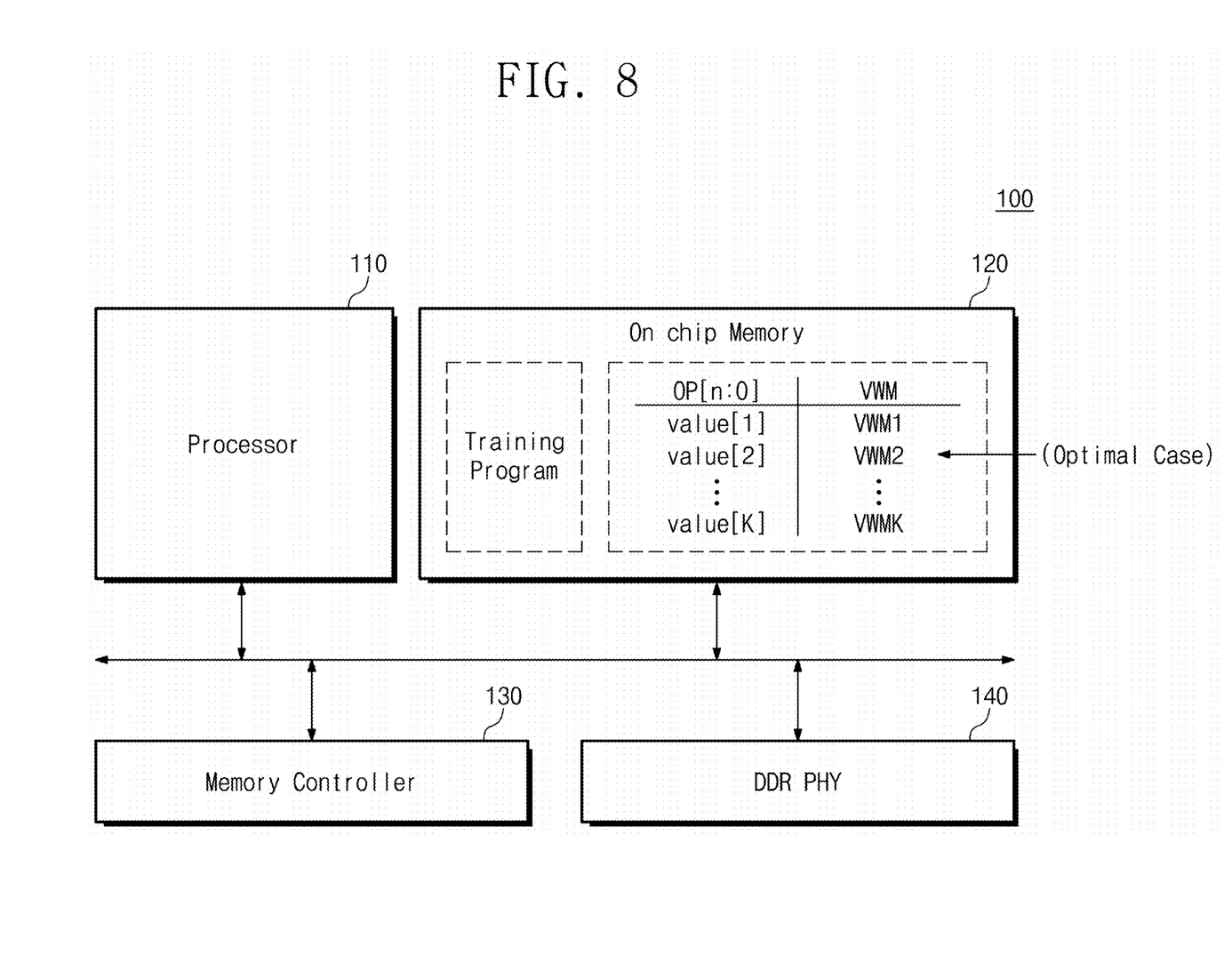
FIG. 8 illustrates VWMs stored in an SoC depending on a flowchart of FIG. 5, according to an embodiment.

FIG. 8 illustrates VWMs stored in an SoC depending on a flowchart of FIG. 5. For convenience of illustration, components of the memory controller 130 and components of the DDR PHY 140 are omitted in FIG. 8.

Table 1 stored in the on chip memory 120 may be a result of performing operation S150 of FIG. 5. For example, the code OP[n:0] may have values value[1], value[2] . . . value[k] (k being a natural number of 2 or more). Referring to a table of FIG. 8, a plurality of VWMs, that is, VWM1 to VWMk, respectively associated with the values value[1], value[2] . . . value[k] of the code OP[n:0] may be calculated by the training program executed by the processor 110 as explained above with reference to FIG. 5.

For example, when VWM2 is a maximum VWM among the plurality of VWMS, a target value of the code OP[n:0] may be value[2] (i.e., in an optimum case). The training program may send a mode register write command to the memory device 200 together with the code OP[n:0] having value[2], and may complete the adjustment of the duty cycle of the internal write clock IWCK of the memory device 200.

Figure 9:
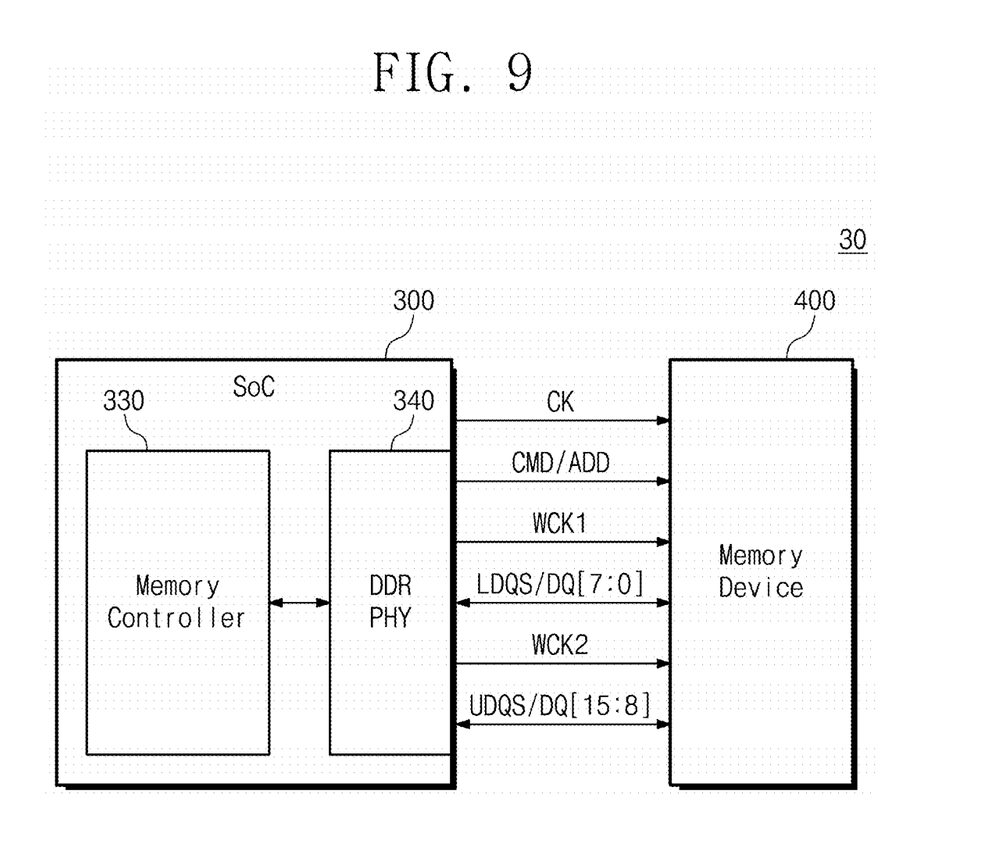
FIG. 9 illustrates is a block diagram of an electronic device according to an embodiment.

FIG. 9 illustrates a block diagram of an electronic device according to another embodiment. An electronic device 30 may include an SoC 300 and a memory device 400. The SoC 300 may include a memory controller 330 and a DDR PHY 340. The SoC 300, the memory controller 330, the DDR PHY 340, and the memory device 400 of FIG. 9 may be implemented to be similar to the SoC 100, the memory controller 130, the DDR PHY 140, and the memory device 200 of FIG. 3.

Referring to FIG. 9, the DDR PHY 340 of the SoC 300 may provide a first write clock WCK1 and a second write clock WCK2 to the memory device 400. The first write clock WCK1 may be provided to the memory device 400 for a first data input/output according to first paths between the SoC 300 and the memory device 400. The second write clock WCK2 may be provided to the memory device 400 for a second data input/output according to second paths between the SoC 300 and the memory device 400. For example, LDQS and DQ[7:0] are signals sent through the first path. UDQS and DQ[15:8] are signals sent through the second path. Each of the LDQS and UDQS may be the DQS described above and each of the DQ[7:0] and the DQ[15:8] may be the DQ described above. The LDQS may be a data strobe signal for the DQ[7:0]. The UDQS may be a data strobe signal for the DQ[15:8].

As in the flowchart of FIG. 5, the SoC 300 may find a target value of a first code for adjusting a duty cycle of a first internal write clock IWCK1 which is generated within the memory device 400 based on the first write clock WCK1 and is used for the first data input/output. Also, as in the flowchart of FIG. 5, the SoC 300 may find a target value of a second code for adjusting a duty cycle of a second internal write clock IWCK2 which is generated within the memory device 400 based on the second write clock WCK2 and is used for the second data input/output. For example, the first code may be OP[3:0] of Table 1, and the second code may be OP[7:4] of Table 1. The number of write clocks, the number of DQSs, the number of DQs, and the number of bits of a code described with reference to FIG. 9 are only exemplary values.

An SoC according to an embodiment of the inventive concept may set a duty cycle of an internal write clock of a memory device to an optimum value by sending a mode register write command and a code to the memory device.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A system on chip comprising:
a first clock generator configured to generate a first clock to be sent to a memory device;
a second clock generator configured to generate a second clock to be sent to the memory device;
a command and address generator configured to generate a code for adjusting a duty cycle of a third clock generated within the memory device based on the second clock, and generate a command for storing the code to mode registers of the memory device, the third clock being used for a data input/output of the memory device;
a data receiver configured to receive a data strobe signal and a data input/output signal output from the memory device receiving the command and the code synchronized with the first clock; and
a training circuit configured to calculate a plurality of valid window margins for the code based on the data strobe signal and the data input/output signal.

2. The system on chip of claim 1, wherein the command and address generator is configured to repeatedly generate the command and the code, and
wherein a plurality of values of the code repeatedly generated by the command and address generator correspond to the plurality of valid window margins, respectively.

3. The system on chip of claim 1, wherein the command and address generator is further configured to generate an address indicating the mode registers of the memory device, and send the address synchronized with the first clock to the memory device.

4. The system on chip of claim 1, wherein a duty cycle adjuster of the memory device is configured to adjust the duty cycle of the third clock depending on a value of the code stored in the mode registers.

5. The system on chip of claim 1, wherein the training circuit is configured to find a target value of the code, which corresponds to a maximum valid window margin of the plurality of valid window margins, from among a plurality of values of the code, and
wherein the command and address generator is configured to send, to the memory device, the target value of the code and a command for storing the target value of the code to the mode registers of the memory device.

6. The system on chip of claim 1, wherein a frequency of the second clock is higher than a frequency of the first clock.

7. The system on chip of claim 1, wherein a first value of the code is changed to a second value by the command and address generator,
wherein a duty cycle of the second clock when the first value of the code is sent to the memory device is identical to a duty cycle of the second clock when the second value of the code is sent to the memory device, and
wherein a duty cycle of the third clock adjusted according to the first value of the code is different from a duty cycle of the third clock adjusted according to the second value of the code.

8. The system on chip of claim 1, wherein, when a value of the code is changed, the command and address generator sends a write command and test data to the memory device.

9. The system on chip of claim 1, wherein the second clock generator comprises a duty cycle adjuster configured to adjust a duty cycle of the second clock to be output to the memory device.

10. The system on chip of claim 1, wherein the memory device is a low power double data rate 5 synchronous dynamic random access memory (LPDDR5 SDRAM) device, and
wherein the command is a mode register write command.

11. An operating method of a system on chip connected with a memory device, the method comprising:
changing a code to be sent to the memory device in synchronization with a first clock, the code being used to adjust a duty cycle of a third clock which is generated within the memory device based on a second clock generated from the system on chip, and is used for a data input/output of the memory device;

calculating a plurality of valid window margins for the code based on a data strobe signal and a data input/output signal output from the memory device receiving the code; and sending a target value of the code corresponding to a maximum valid window margin of the plurality of valid window margins to the memory device.

12. The method of claim 11, wherein the changing the code comprises:

generating a command for writing a value of the code to mode registers of the memory device;

generating an address indicating the mode registers in which the value of the code is to be stored; and sending the command, the address, and the value of the code synchronized with the first clock to the memory device.

13. The method of claim 11, wherein the calculating the plurality of valid window margins for the code comprises:

generating a write command for writing test data to the memory device and sending the write command to the memory device; and generating a read command for reading the test data stored in the memory device by the write command and sending the read command to the memory device.

14. The method of claim 13, wherein the data strobe signal and the data input/output signal are output from the memory device operating based on the third clock.

15. The method of claim 14, wherein the sending the write command to the memory device comprises:

sending the test data to the memory device through command and address transmission paths.

16. An electronic device comprising:

a system on chip configured to generate a first clock and a second clock having a frequency higher than a frequency of the first clock; and a memory device synchronized with the first clock and the second clock output from the system on chip, wherein the system on chip is further configured to:

generate a command and a code synchronized with the first clock; and train a duty cycle of a third clock which is generated within the memory device based on the second clock and is used for a data input/output of the memory device, by sending the command and the code to the memory device.

17. The electronic device of claim 16, wherein a first data input/output being the data input/output is performed through first paths between the system on chip and the memory device, wherein a second data input/output of the memory device is performed through second paths between the system on chip and the memory device, wherein the system on chip is configured to further generate a fourth clock having a frequency identical to the frequency of the second clock, and wherein the system on chip is further configured to train a duty cycle of a fifth clock which is generated within the memory device based on the fourth clock and is used for the second data input/output of the memory device, by sending the command and the code to the memory device.

18. The electronic device of claim 16, wherein the system on chip is further configured to:

calculate a plurality of valid window margins for the code based on a data strobe signal and a data input/output signal output from the memory device; and send a target value of the code corresponding to a maximum valid window margin among the plurality of valid window margins and the command to the memory device.

19. The electronic device of claim 18, wherein the command is a mode register write command, and wherein the system on chip is further configured to send a write command and a read command synchronized with the first clock to the memory device after sending the code to the memory device, and receive the data strobe signal and the data input/output signal from the memory device based on the read command.

20. The electronic device of claim 19, wherein the memory device is a low power double data rate 5 synchronous dynamic random access memory (LPDDR5 SDRAM) device, and wherein the target value of the code is stored to mode registers of the memory device.

* * * * *